United States Patent
Lee et al.

(10) Patent No.: US 10,128,116 B2
(45) Date of Patent: Nov. 13, 2018

(54) INTEGRATED DIRECT DIELECTRIC AND METAL DEPOSITION

(71) Applicant: Lam Research Corporation, Fremont, CA (US)

(72) Inventors: William T. Lee, Dublin, CA (US); Bart J. van Schravendijk, Palo Alto, CA (US); David Charles Smith, Lake Oswego, OR (US); Michal Danek, Cupertino, CA (US); Patrick A. Van Cleemput, San Jose, CA (US); Ramesh Chandrasekharan, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/593,187

(22) Filed: May 11, 2017

(65) Prior Publication Data
US 2018/0108529 A1    Apr. 19, 2018

Related U.S. Application Data

(60) Provisional application No. 62/409,269, filed on Oct. 17, 2016.

(51) Int. Cl.
*H01L 21/00* (2006.01)
*H01L 21/28* (2006.01)
(Continued)

(52) U.S. Cl.
CPC .. *H01L 21/28202* (2013.01); *G02F 1/133502* (2013.01); *H01J 37/3244* (2013.01);
(Continued)

(58) Field of Classification Search
CPC .............. H01L 21/28202; H01L 29/513; H01J 37/3244
See application file for complete search history.

(56) References Cited

U.S. PATENT DOCUMENTS

| 6,888,040 B1* | 5/2005 | Shufflebotham | B01D 53/70 |
| | | | 423/240 R |
| 7,186,569 B2 | 3/2007 | Rinerson et al. | |

(Continued)

FOREIGN PATENT DOCUMENTS

| KR | 10-2016-0017610 | 2/2016 | |
| WO | WO 2018075225 A1 * | 4/2018 | G02F 1/133502 |

OTHER PUBLICATIONS

ChiaHua Ho et al., "Random soft error suppression by stoichiometric engineering: CMOS compatible and reliable 1Mb HfO2-ReRAM with 2 extra masks for embedded IoT systems," *2016 IEEE Symposium on VLSI Technology*, Honolulu, HI, (Sep. 22, 2016), pp. 28-29. doi: 10.1109/VLSIT.2016.7573366.

(Continued)

*Primary Examiner* — Laura Menz
(74) *Attorney, Agent, or Firm* — Weaver Austin Villeneuve & Sampson, LLP.

(57) ABSTRACT

Efficient integrated sequential deposition of alternating layers of dielectric and conductor, for example oxide/metal or metal nitride, e.g., SiO2/TiN, in a single tool, and even in a single process chamber enhances throughput without compromising quality when directly depositing a OMOM stack with many layers. Conductor and dielectric film deposition of a stack of at least 20 conductor/dielectric film pairs in the same processing tool or chamber, without breaking vacuum between the film depositions, such that there is no substantial cross-contamination between the conductor and dielectric film depositions, can be achieved.

20 Claims, 5 Drawing Sheets

(51) Int. Cl.
*G02F 1/1335* (2006.01)
*H01J 37/32* (2006.01)
*H01L 21/02* (2006.01)
*H01L 29/51* (2006.01)

(52) U.S. Cl.
CPC ...... *H01J 37/32788* (2013.01); *H01L 21/022* (2013.01); *H01L 21/02175* (2013.01); *H01L 21/28211* (2013.01); *H01L 29/513* (2013.01)

(56) References Cited

U.S. PATENT DOCUMENTS

| | | | |
|---|---|---|---|
| 7,592,217 B2 | 9/2009 | Lee | |
| 8,664,560 B2* | 3/2014 | Shufflebotham | B01D 53/70 |
| | | | 118/715 |
| 8,846,484 B2 | 9/2014 | Lee et al. | |
| 9,023,693 B1 | 5/2015 | Lin et al. | |
| 9,184,060 B1* | 11/2015 | Lee | H01L 21/31144 |
| 9,249,502 B2 | 2/2016 | Albano et al. | |
| 9,797,042 B2* | 10/2017 | Nowak | C23C 16/54 |
| 2003/0235719 A1* | 12/2003 | Grimal | C03C 17/3435 |
| | | | 428/698 |
| 2004/0228172 A1 | 11/2004 | Rinerson et al. | |
| 2005/0155854 A1* | 7/2005 | Shufflebotham | B01D 53/70 |
| | | | 204/164 |
| 2006/0097305 A1 | 5/2006 | Lee | |
| 2009/0325063 A1 | 12/2009 | Albano et al. | |
| 2011/0135842 A1 | 6/2011 | Faguet et al. | |
| 2012/0280369 A1 | 11/2012 | Saito et al. | |
| 2013/0285695 A1 | 10/2013 | Verma et al. | |
| 2013/0316518 A1* | 11/2013 | Hollister | H01L 21/0245 |
| | | | 438/478 |
| 2015/0004798 A1 | 1/2015 | Chandrasekharan et al. | |
| 2015/0115450 A1 | 4/2015 | JangJian et al. | |
| 2015/0332912 A1* | 11/2015 | Nowak | C23C 16/54 |
| | | | 438/778 |
| 2016/0068953 A1 | 3/2016 | Li et al. | |
| 2016/0163556 A1* | 6/2016 | Briggs | H01L 21/30655 |
| | | | 438/696 |
| 2016/0181259 A1* | 6/2016 | Van Houdt | H01L 27/1159 |
| | | | 365/145 |
| 2016/0293609 A1* | 10/2016 | Jha | H01L 21/02274 |
| 2017/0029947 A1 | 2/2017 | Kawahara et al. | |
| 2017/0029948 A1 | 2/2017 | Jongbloed et al. | |
| 2017/0101710 A1 | 4/2017 | Chandrasekharan et al. | |
| 2018/0010250 A1* | 1/2018 | Nowak | C23C 16/54 |
| 2018/0108529 A1* | 4/2018 | Lee | G02F 1/133502 |
| 2018/0178207 A1* | 6/2018 | Steinhauer | B82Y 40/00 |

OTHER PUBLICATIONS

Xiaoxin Xu et al., "Fully CMOS compatible 3D vertical RRAM with self-aligned self-selective cell enabling sub-5nm scaling," *2016 IEEE Symposium on VLSI Technology*, Honolulu, HI, (Sep. 22, 2016), pp. 84-85. doi: 10.1109/VLSIT.2016.7573388.

Non-Final Rejection, dated Sep. 22, 2016, for U.S. Appl. No. 13/930,289, filed Jun. 28, 2013.

U.S. Appl. No. 15/186,275, filed Jun. 17, 2016, Karim et al.

Non-Final Rejection, dated Nov. 22, 2016, for U.S. Appl. No. 15/186,275, filed Jun. 17, 2016.

Notice of Allowance and Fees Due (PTOL-85), dated Apr. 14, 2017, for U.S. Appl. No. 15/186,275, filed Jun. 17, 2016.

International Search Report, dated Jan. 11, 2018, for International Patent Application PCT/US2017/054485.

* cited by examiner

INTEGRATED DIRECT DIELECTRIC AND METAL DEPOSITION

CROSS-REFERENCE TO RELATED APPLICATIONS

This application claims benefit of U.S. Provisional Patent Application No. 62/409,269, filed Oct. 17, 2016, and titled "INTEGRATED DIELECTRIC AND METAL DEPOSITION," which is incorporated by reference herein in its entirety and for all purposes.

BACKGROUND

As memory density continues to increase, the industry has turned to 3D structures. Vertically-arranged storage devices are constructed within stacks of alternating layers of dielectric and metal in 3D NAND devices. And there are new types of memory such as PCRAM, ReRAM, FeRAM, etc. that will also utilize similar 3D configurations.

Currently, the stacks of alternating layers of dielectric and metal in 3D NAND devices are constructed by first depositing alternating layers of permanent dielectric (e.g., $SiO_2$) and temporary/sacrificial dielectric (e.g., $Si_3N_4$). Then, after channel hole etch and NAND device formation in the channel hole, the $Si_3N_4$ layers are removed, typically by wet etch, and replaced by metal layers (e.g., TiN barrier plus W fill for the lateral wordlines in 3D NAND). As the stacks get taller (e.g., from first generation 24/36-pair to future 96/>100-pair), the vertical features (such as channel holes, slits/trenches, staircases, etc.) will become more difficult to etch, and the lateral metal (wordline for 3D NAND) layers more difficult to fill post-$Si_3N_4$ removal.

SUMMARY

This disclosure relates to apparatus and methods to efficiently and effectively directly deposit a dielectric/conductor stack, also referred to herein as an OMOM (oxide/metal) stack. Currently, oxide deposition and metal/metal nitride deposition are generally performed in separate tools, with oxide and metal/metal nitride dedicated process chambers. Efficient sequential deposition of alternating layers of oxide and metals in a single tool, and even in a single process chamber, reduces or minimizes the non-value added time of moving wafers between tools or between chambers when directly depositing an OMOM stack with many layers. Such apparatus and methods are provided herein.

For the purposes of this disclosure, "metal" used in this OMOM context should more generally understood in various embodiments to mean a conductor with a maximum resistivity of 500 micro Ohm cm. And "oxide" used in this OMOM context should more generally understood in various embodiments to mean a dielectric. Thus, in various embodiments, the conductor in the OMOM stack may be a metal, such as Ti, or a conductive metal salt, in particular a conductive metal nitride, for example, TiN; and the dielectric may be an oxide, such as silicon dioxide ($SiO_2$).

In various embodiments, the disclosed apparatus and methods can be generalized to other multi-film sequential direct dielectric/conductor deposition, particularly using multi-pedestal process modules, on a multi-module platform, running pedestals or modules in sequential or batch modes. The disclosure relates to hardware features to implement direct dielectric/metal deposition in the same process module, as well as to methods to reduce wafer handling overhead moving wafers between pedestals and process modules, and within a single vacuum process environment.

Various embodiments of a method of forming a film stack on a patterned semiconductor substrate are provided. Disclosed methods involve depositing a conductive film and depositing a dielectric film, such that the conductive and dielectric film depositions result in the formation of a conductor/dielectric film pair on a patterned semiconductor substrate. Then, the depositing of the conductive and dielectric films are repeated to form a film stack comprising at least 20 pairs of alternating layers of conductor film and dielectric film. The conductive and dielectric film depositions are conducted in the same processing tool or chamber, without breaking vacuum between the film depositions, and there is no substantial cross-contamination between the conductive and dielectric film depositions.

In some implementations, the conductor (e.g., metal and/or conductive metal nitride) and dielectric (e.g., oxide), e.g., TiN and $SiO_2$, film pair depositions are conducted in different modules of the same tool without breaking vacuum between the depositions. In some implementations, the conductor/dielectric film pair depositions are conducted on different stations in the same module of the same tool without breaking vacuum between the depositions. In some other implementations, the conductor/dielectric film pair depositions are conducted on the same station in the same module of the same tool without breaking vacuum between the depositions.

In some implementations, at least 20 pairs of the conductor/dielectric film pairs are deposited at a rate of at least 5 wafers per hour.

In another aspect, the disclosure relates to apparatus for integrated formation a film stack comprising layers of conductor and dielectric film on a patterned semiconductor substrate. The conductor and dielectric film depositions are conducted in the same processing tool or chamber, without breaking vacuum between the film depositions; and wherein there is no substantial cross-contamination between the conductor and dielectric film depositions. Apparatus architecture permits deposition of a stack of at least 20 conductor/dielectric film pairs at a rate of at least 5 wafers per hour.

In some implementations of the apparatus, the conductor and dielectric (e.g., metal nitride and oxide, e.g., TiN and $SiO_2$) pair depositions are conducted in different modules of the same tool without breaking vacuum between the depositions. In some implementations of the apparatus, the conductor/dielectric film pair depositions are conducted on different stations in the same module of the same tool without breaking vacuum between the depositions. In some other implementations of the apparatus, the conductor/dielectric film pair depositions are conducted on the same station in the same module of the same tool without breaking vacuum between the depositions.

These and other aspects the disclosure are further described below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

INTRODUCTION

Efficient sequential deposition of alternating layers of dielectric and metals in a single tool, and even in a single process chamber, enhances throughput without compromising quality when directly depositing a dielectric/metal stack with many layers. For the purposes of this disclosure, "metal" used in this context should be understood to mean conductor with a maximum resistivity of 500 micro Ohm cm, including metals and conductive metal salts, in particular conductive metal nitrides, e.g., TiN. Such apparatus and methods are provided herein.

Figure 1:
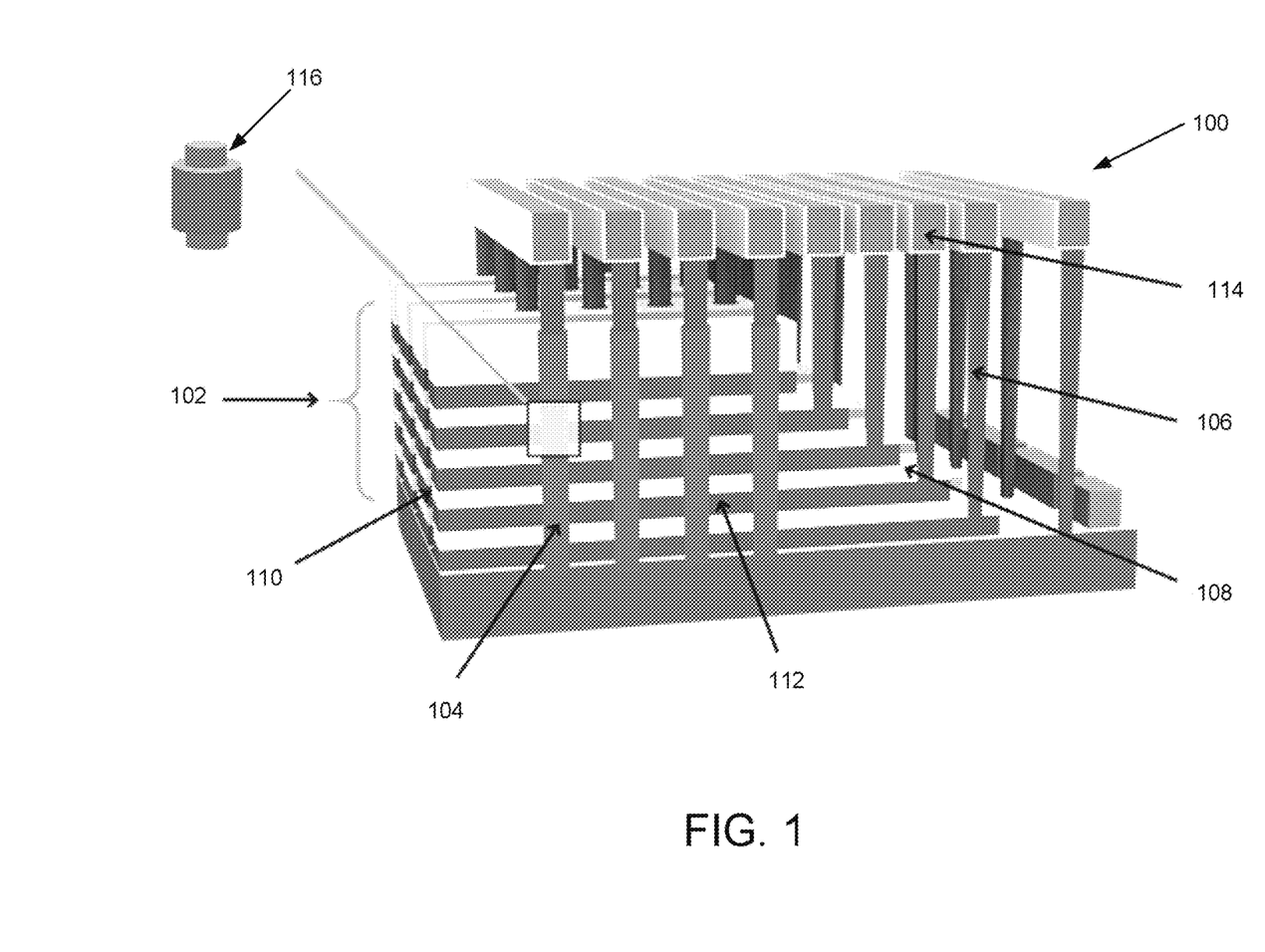
FIG. 1 depicts a representative 3D NAND device including an OMOM film stack.

In typical current 3D NAND manufacturing, the "mold stack" comprising a stack of 24 to 64 pairs of $SiO_2/Si_3N_4$ layers is typically deposited in a PECVD dielectric deposition tool. The $SiO_2$ layer and $Si_3N_4$ layer are deposited sequentially on each station (also referred to as a pedestal) without moving the wafer until the entire stack, or a substantial fraction of the stack, is deposited. Vertical channels are then etched down through the oxide and nitride layers in the mold stack by high aspect ratio etching, and filled with metal to form contacts. Then, a thick photoresist layer is applied and patterned, one set of oxide/nitride pairs is etched and then the photoresist pattern is shrunk and the next pair of oxide/nitride layers is etched. This sequence is repeated to create a stair step structure at the edge of the array. After a thick oxide layer is deposited and planarized, a word line slot mask is applied and a slot is etched down through all of the oxide/nitride layer pairs. The nitride layers are then etched out through the word line slot. A gate stack of silicon dioxide, silicon nitride, aluminum oxide, tungsten and tantalum nitride is then deposited and etched back and finally the slot is filled with oxide and tungsten. Metal deposition occurs in a separate metal fill tool such as Lam's ALTUS Max. A typical 3D NAND device 100 formed in this way is depicted in FIG. 1, showing the stack 102, channel 104 and contact metal fill 106, staircase formed by staircase etch 108, slit 110 and wordline metal fill 112, and bitline 114, above. A single memory cell 116 is shown enlarged.

This approach works for layers at the current stack layer thickness of approximately 25 nm to 30 nm each, but becomes difficult for lower thicknesses, for example approximately 10 nm to 15 nm each. The need for thinner layers is driven by the need to control the total stack thickness (e.g., to maintain total planarity for lithography, to minimize total wafer bow from accumulated stress, to ease etch requirements, etc.). Therefore this "ONON" (oxide/nitride) deposition followed by replacement of 'N' by metal, or other metal-containing conductive material, may eventually become impractical.

According to currently available methodologies to directly deposit a dielectric/metal stack, the wafer has to move between dielectric-specific deposition tool and metal-specific deposition tool, which would typically be in different parts of a semiconductor fabrication plant. Therefore, for an n-pair stack, the wafer would have to travel $2n$ times between tools. This is extremely time-consuming, creates a tremendous amount of WIP (work-in-progress) wafer inventory, and adds an unacceptable amount of cost.

A PVD (either evaporation type, or sputter type) with multiple targets (one for dielectric and the other for metal) could be used to directly deposit alternating dielectric/metal layers in a stack without breaking vacuum. However, these tools tend to deposit films that are not uniform enough for use in high-layer count 3D memory devices, and the dielectric quality using PVD methods tend to be of poor quality due to intrinsic damage, defects and/or traps.

The present disclosure describes apparatus and processes for efficiently depositing both very smooth, high-quality dielectric and metal/conductive metal-containing layers with excellent thickness uniformity on the same tool, and even in the same process module: Integrated direct dielectric and metal deposition.

Integrated OMOM Film Stack Deposition Processes

Figure 2:
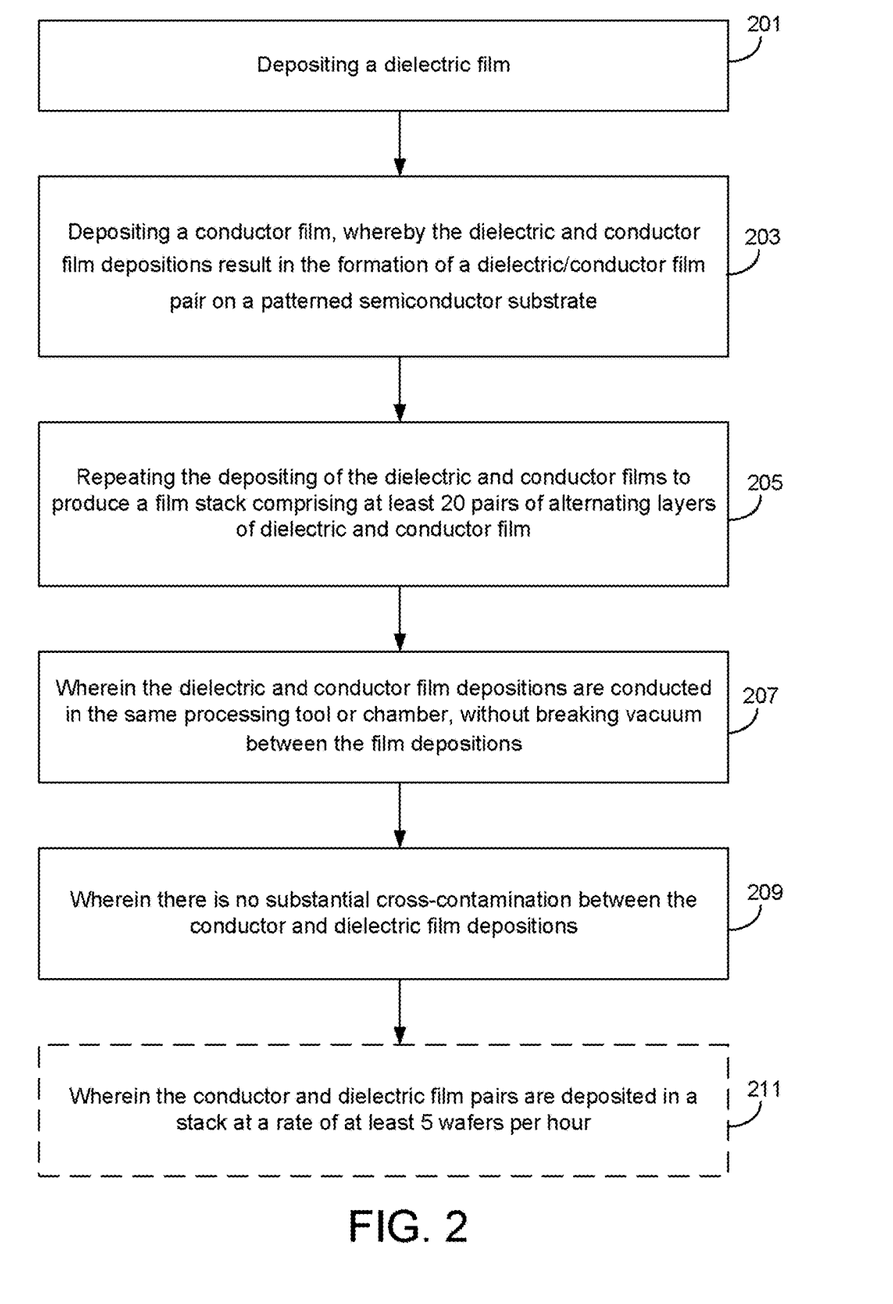
FIG. 2 shows a flow chart illustrating a method for depositing an OMOM (oxide/metal) film stack in-situ using a plurality of plasma-activated film deposition phases, in accordance with one embodiment.

Various embodiments of a method of forming a film stack on a patterned semiconductor substrate are provided. FIG. 2 provides a process flow for disclosed methods including depositing a dielectric film (201) and depositing a conductive film, such that the dielectric and conductive film depositions result in the formation of a dielectric/conductor film pair on a patterned semiconductor substrate (203). Then, the depositing of the conductive and dielectric films are repeated to form a film stack comprising at least 20 pairs of alternating layers of conductor film and dielectric film (205). The conductive and dielectric film depositions are integrated by being conducted in the same processing tool or chamber, without breaking vacuum between the film depositions (207), and there is no substantial cross-contamination between the conductive and dielectric film depositions (209).

The integrated deposition enhances throughput. In various embodiments, particularly in which conductor and dielectric deposition are conducted in the same module, the conductive and dielectric film pairs are deposited in the stack at a rate of at least 5 wafers per hour (211, shown in broken lines as a feature of some but not necessarily all embodiments).

In one aspect, the disclosure relates to a method of forming a film stack comprising pairs of alternating layers of titanium nitride (TiN; metal) film and silicon oxide ($SiO_2$; oxide) film on a patterned semiconductor substrate. The method involves depositing a TiN film, the TiN film formed from the reaction of a TiN precursor, and depositing a silicon oxide film, the silicon oxide film formed from the reaction of one or more precursor comprising silicon and an oxidant, and repeating the depositing of the TiN and the $SiO_2$ film to form a film stack comprising at least 20 pairs of alternating layers of TiN and $SiO_2$ films. The TiN and $SiO_2$ film film pair depositions are conducted in the same processing tool or chamber, without breaking vacuum between the film depositions, and there is no substantial cross-contamination between the TiN and $SiO_2$ film depositions.

In some implementations, the conductor (e.g., metal and/or conductive metal nitride) and dielectric (e.g., silicon oxide) film pair depositions are conducted in different modules of the same tool without breaking vacuum between the depositions. In some implementations, the metal and/or conductive metal nitride and silicon oxide film pair depositions are conducted on different stations in the same module of the same tool without breaking vacuum between the depositions. In some other implementations, the metal and/or conductive metal nitride and silicon oxide film pair depositions are conducted on the same station in the same module of the same tool without breaking vacuum between the depositions.

In some implementations, at least 20 pairs of the metal and/or conductive metal nitride and silicon oxide film pairs are deposited at a rate of at least 5 wafers per hour. In other implementations, least at least 40 pairs, or at least 50, 60, 70, 80, 90 or 100 pairs of the metal and/or conductive metal nitride and silicon oxide film pairs are deposited.

In various implementations, the silicon oxide precursor can be silane or TEOS, or other Si-based precursors typically used for $SiO_2$ deposition processes. Examples of suitable $SiO_2$ precursors include Si-based precursors that contain H, halides, alkoxides, alkyl and amide ligands, such as $SiH_4$, $SiH_2Cl_2$, $Si(OET)_4$, $Si(NMe_2)_4$, $SiX_nH_y$ (where X is a halide, n=0-4 and y=4−n), $Si(OR)_4$ (where R is an alkyl group such at methyl, ethyl, etc.), and $SiH_x(NR_2)_y$, (where R is an alkyl, x=1-3, y=4−x). Examples of suitable oxidizers include $O_2$, $N_2O$, $CO_2$, $O_3$ and CO.

In various implementations, the one or more metal and/or metal nitride precursor can be metal and or metal nitride precursors used for thermal CVD, PECVD or ALD of such thin films, such as metal halides, metal amides and organometallics for metals/conductors such as titanium, titanium nitride, tantalum, tantalum nitride, tungsten, tungsten nitride, cobalt, and cobalt nitride. Specific examples include PECVD with $TiCl_4$ or ALD with $TiCl_4$, and $NH_3$ or $H_2/N_2$.

In some implementations, an inert gas species is introduced to the processing chamber between the metal and/or metal nitride and oxide depositions.

Integrated—Same Tool/Different Modules

Figure 3:
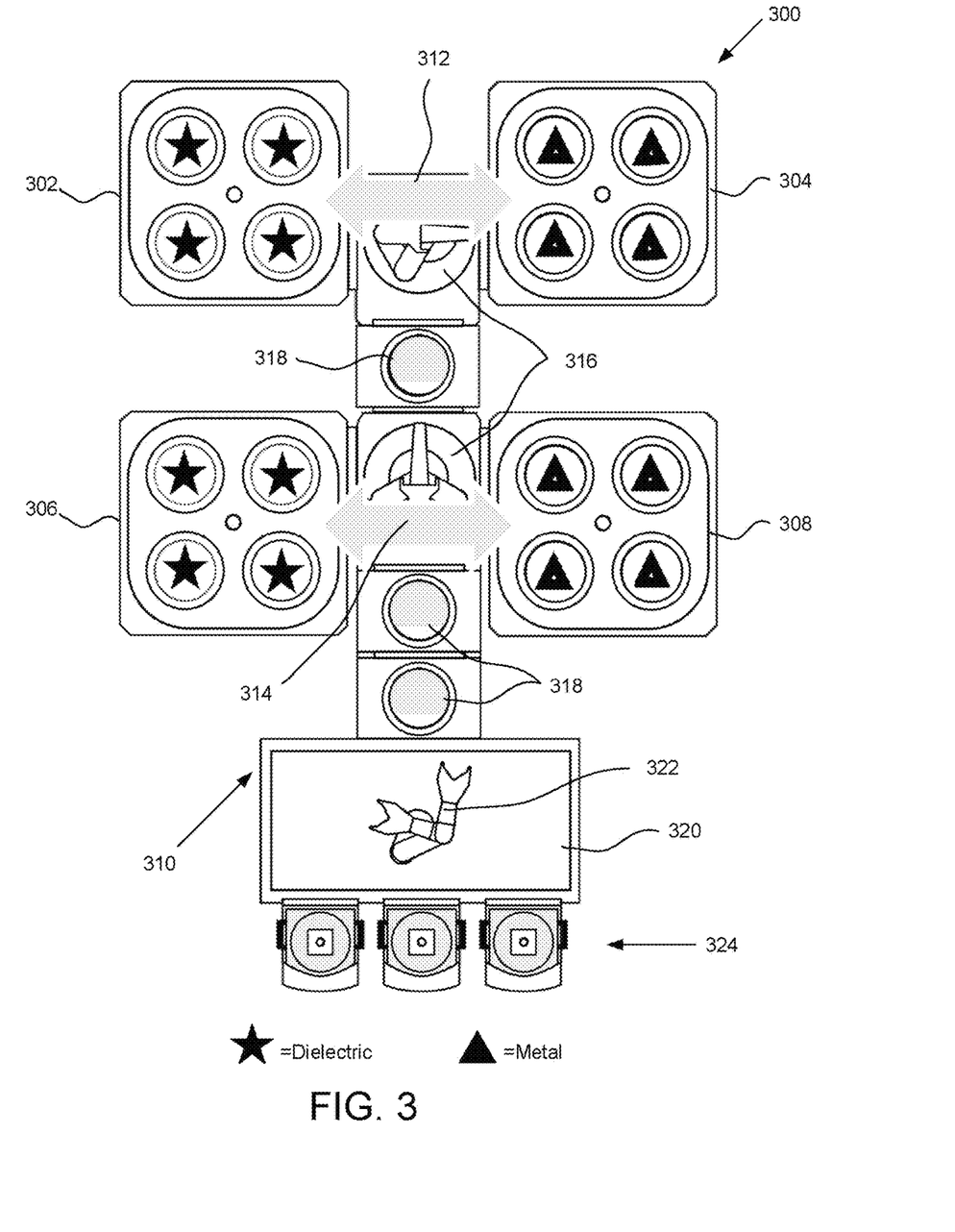
FIG. 3 depicts integrated dielectric and metal deposition implemented in different modules of the same tool, in accordance with a first embodiment.

Referring to FIG. 3, in a first embodiment, integrated dielectric and metal deposition may be implemented in different modules 302, 304, 306, 308 of the same tool 300. For example, Lam Research Strata PECVD and/or Striker ALD dielectric deposition modules may be integrated in the same tool platform as Lam Research ALTUS metal deposition modules. In this way, there is no air break between layers, and each module optimized for each film type (reactor type, pressure, temp, etc.). As a result, technical performance is not compromised by having metal and dielectric process gases, films and by-products in the same process tool and there is no cross-contamination (gate valves between modules), resulting in excellent film properties.

Referring to FIG. 3, a suitable tool 300 may be configured with at least one pair of dielectric and metal deposition modules, in this implementation two dielectric deposition modules 302, 306, such as the VECTOR Strata PECVD or Striker ALD dielectric deposition modules, available from Lam Research Corporation, Fremont, Calif., and two metal deposition modules 304, 308, such as Lam Research ALTUS metal deposition module. A suitable tool 300 configuration includes four QSMs (quad-station modules) 302, 304, 306, 308 on a Lam Mach IQ platform 310.

The platform 310 includes a load lock 320 and robot 322 is configured to move wafers from a cassette loaded through one or more pods 324 into the load lock 320 via an atmospheric port. A wafer may be heated or exposed to plasma when inbound in the load lock 320, for example, to remove moisture and adsorbed gases, or for other pretreatment reasons. Then another robot (e.g., 316) can place the wafer into a deposition module for processing.

As depicted by the arrows 312 and 314 in FIG. 3, wafers can be transferred back and forth between dielectric and metal deposition modules without breaking vacuum to conduct the alternating dielectric and metal depositions to form the stack. In addition, unequal dielectric and metal process times can be addressed by different module ratios (e.g., if dielectric deposition time is twice the metal deposition time, then the tool can be configured with twice the dielectric modules than metal modules).

Potential large wafer transfer time overhead may be offset through the use of a many-bladed transfer robot 316 to permit some batch load and unload, and the use buffer station(s) 318, for example, heat-up/cool-down stations between dielectric and metal depositions at different temperatures.

Integrated In-Situ Sequential—Same Tool/Same Module/Different Pedestals

Figure 4:
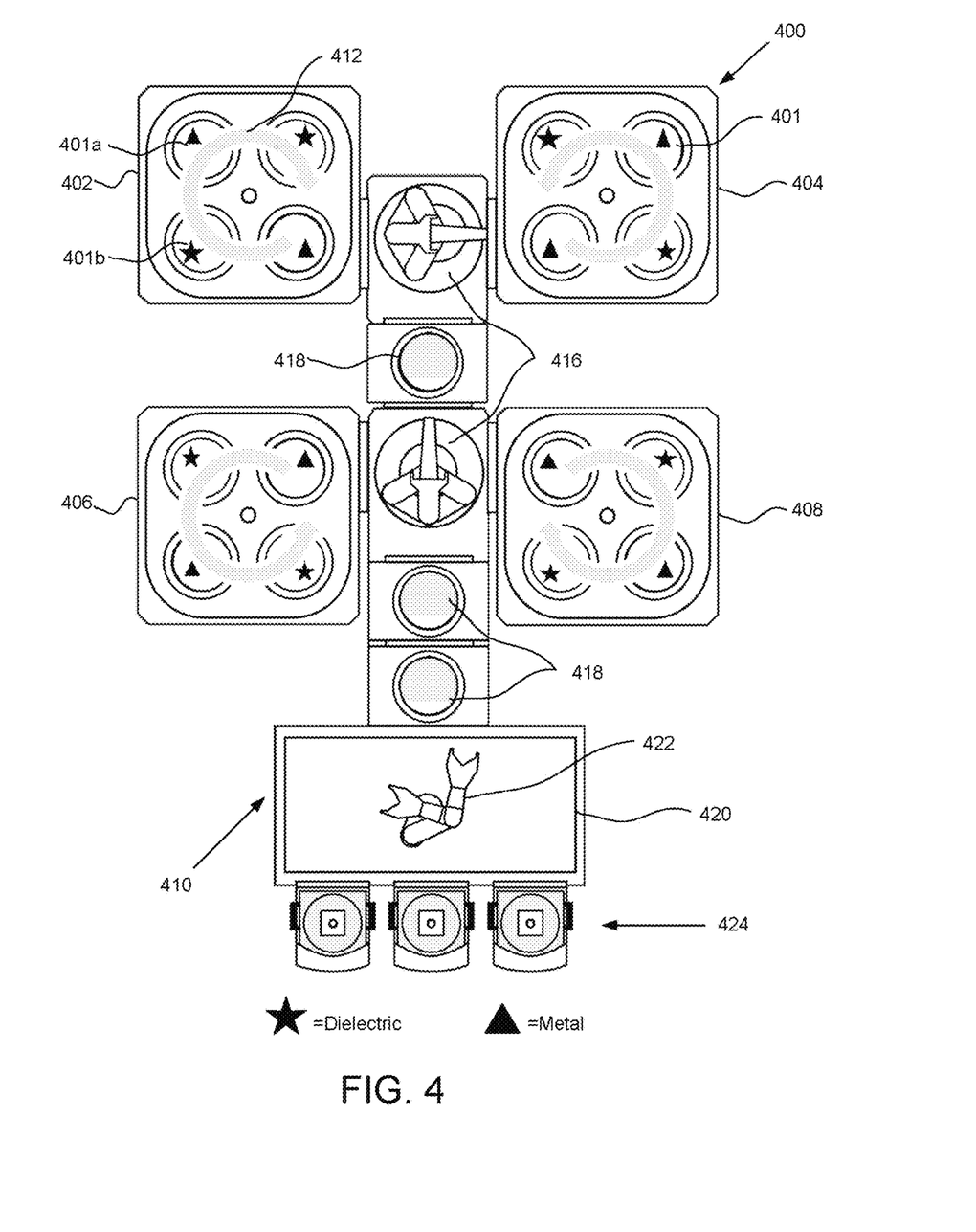
FIG. 4 depicts an integrated dielectric and metal deposition implemented on different pedestals in the same module(s) of the same tool, in accordance with a second embodiment.

Referring to FIG. 4, in a second embodiment, integrated dielectric and metal deposition may be implemented on different pedestals 401 in the same module(s) 402 of the same tool 400. A suitable tool 400 may be configured for integrated in-situ sequential processing in accordance with this embodiment with at least one dielectric and metal deposition module, in this implementation four QSMs (quad-station modules) 402, 404, 406, 408 on a Lam Mach IQ platform 410. The platform 410 includes a load lock 420 and robot 422 is configured to move wafers from a cassette loaded through one or more pods 424 into the load lock 420 via an atmospheric port. A wafer may be heated or exposed to plasma when inbound in the load lock 420, for example, to remove moisture and adsorbed gases, or for other pretreatment reasons. Then another robot (e.g., 416) can place the wafer into a deposition module for processing.

For example, Lam Research Strata PECVD and/or Striker ALD dielectric deposition modules station designs may be integrated in the same module as Lam Research ALTUS metal deposition module station designs. Or, Lam Research Strata PECVD and/or Striker ALD dielectric deposition modules station designs may be adapted such that dielectric and metal deposition may be effectively conducted at different stations within the same module. For example, station/pedestal 401a may be a dielectric deposition station and station 401b may be a metal deposition station, with the wafers rotated between stations within the module 402, as indicated by arrow 412. In this way, there also is no air break between layers, and indexing a wafer from pedestal to pedestal is faster than transferring wafers between process modules via a central handling robot 416. As a result, efficiency (throughput) is enhanced without substantially sacrificing technical performance, and cross-contamination is controlled or minimized, resulting in excellent film properties.

In addition, each station/pedestal can be configured or optimized for each deposition type, and pedestals can be isolated from each other to reduce or minimize cross-contamination/cross-talk between dielectric and metal deposition processes, for example by gas curtains or other station-specific barriers like gas seals, such as are described, for example, in application Ser. Nos. 13/930,289 and 15/385,089, the disclosures of which in this regard are hereby incorporated by reference herein. Within ranges, each pedestal process can be at a different temperature and pressure. And each station's pedestal, showerhead, wall, etc. temperature can be independently set optimally for each process, without needing to cycle. Gas distribution to each station can be kept separate. By adding multiple throttle valves, one for the dielectric (e.g., oxide) stations and one for the metal (e.g., TiN) stations, pressures can be independently maintained. Exhaust for each station can be local and not shared, so that the exhaust can stay independent without cross mixing/contamination of gases.

In some implementations, the different stations are each micro-volume stations, and may be particularly configured or operated to prevent cross-contamination between stations in the module. Such configuration or operational features include virtual sealing with curtain gas or gas seals such as described in application Ser. Nos. 15/186,275, 13/930,289 and 15/385,089 incorporated by reference herein, using inert gases that allow for each micro-volume to run isolated from the larger chamber volume. The modules can also be equipped with dedicated gas flow valving at each station to enable separate flow to each station, and local pumping out of the micro-volume through the side or top can be conducted to avoid mixing of exhaust. Fully ceramic station hardware can be used for metal halide (e.g., $TiCl_4$) stations to avoid corrosion or contamination from Al or other metals.

Further, the number of pedestals in a multi-station process module can be varied, for example two or more, not necessarily four. The ratio of dielectric to metal pedestals can be varied, for example in a QSM 2:2 or a different ratio such as 1:3, for example to account for variability in step times. If the metal is not a single layer but has barrier/liners on either side (e.g., WN/W/WN), then pedestals (stations) within a multi-station module may be configured accordingly, for example pedestal 1=dielectric, pedestal 2=liner 1, pedestal 3=metal, pedestal 4=liner 2. A pedestal can also serve a different function such as pre-heat, chemical pre-treat, cool-down, post-treat, nucleation, etc. or other operation.

Potential large wafer transfer time overhead may be offset through the use of a many-bladed transfer robot 416 to permit some batch load and unload, including prior to and after stack deposition completion, or wafers may be transferred between modules during stack deposition, for example to enhance wafer-to-wafer uniformity. Efficiency may also be enhanced the use buffer station(s) 418, for example, heat-up/cool-down stations between dielectric and metal depositions at different temperatures.

This in-situ sequential MSM (multi-station module) implementation, in particular, offers the prospect of enhanced performance in a commercial scale, quality and throughput context. Efficiency (throughput) is enhanced without substantially sacrificing technical performance, so that a maximum acceptable threshold of cross-contamination is not crossed, and/or process variability due to off-target deposition effects changing the deposition characteristics of the pedestal over time and across wafers is controlled in a well-engineered and controlled MSM tool.

Integrated In-Situ Temporal Batch—Same Tool/Same Module/Same Pedestal

Figure 5:
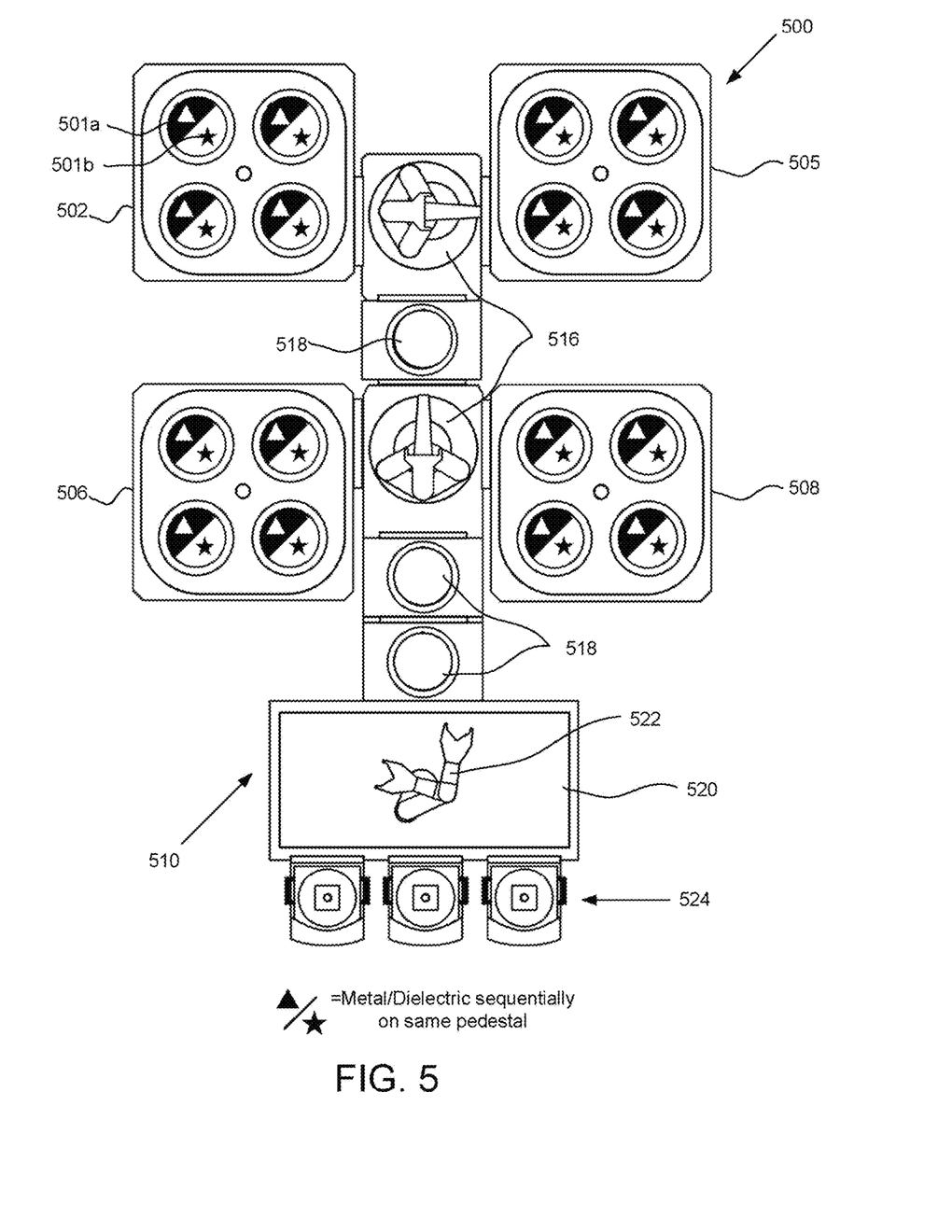
FIG. 5 depicts an integrated dielectric and metal deposition sequentially implemented on the same pedestal(s) in the same module(s) of the same tool, in accordance with a third embodiment.

Referring to FIG. 5, in a third embodiment, integrated dielectric and metal deposition may be sequentially implemented on the same pedestal(s) 501 (501a/501b) in the same module(s) 502 of the same tool 500. A suitable tool 500 may be configured for in-situ temporal batch processing in accordance with this embodiment with at least one dielectric and metal deposition module, in this implementation four QSMs (quad-station modules) 502, 504, 506, 508 on a Lam Mach IQ platform 510. The platform 510 includes a load lock 520 and robot 522 is configured to move wafers from a cassette loaded through one or more pods 524 into the load lock 520 via an atmospheric port. A wafer may be heated or exposed to plasma when inbound in the load lock 520, for example, to remove moisture and adsorbed gases, or for other pre-treatment reasons. Efficiency may also be enhanced the use buffer station(s) 518, for example, heat-up/cool-down stations between dielectric and metal depositions at different temperatures. Then another robot (e.g., 516) can place the wafer into a deposition module for processing.

For example, aspects of Lam Research Strata PECVD and/or Striker ALD dielectric deposition modules station designs may be integrated on the same pedestal (station) in the same module as aspects of Lam Research ALTUS metal deposition modules station designs. Or, Lam Research Strata PECVD and/or Striker ALD dielectric deposition module station designs may be adapted such that dielectric and metal deposition may be effectively conducted at the same stations within the same module. In this way, there again is no air break between layers. In some implementations, the different stations are each micro-volume stations, and may be particularly configured or operated to prevent cross-contamination between deposition operations conducted on the same stations in the module. Such configuration or operational features include gas seals such as described in application Ser. Nos. 13/930,289 and 15/385,089 incorporated by reference herein. The modules can be equipped with dedicated gas flow valving at each station to enable separate flow to each station, and local pumping out of the micro-volume through separate side or top outlets can be conducted to avoid mixing of exhaust. Fully ceramic station hardware can be used for metal halide (e.g., $TiCl_4$) stations to avoid corrosion or contamination from Al or other metals. Since each wafer does not move between dielectric and metal deposition operations, this should have high throughput and low cost-per-wafer implementation.

Controller

In some implementations, apparatus in accordance with this disclosure may incorporate one or more system controllers, in or associated with the individual modules and/or in or associated with the tool, such as a part of the tool platform 410, 410, 510. A suitable controller includes machine-readable instructions for movement of the wafers, into, through and out of modules and the tool, flowing reagent gas species to the module processing chamber(s)/station(s), and otherwise implementing the integrated conductor and dielectric deposition processes.

The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller.

In some implementations, the system controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Depending on the process step or steps to be performed by the tool, the system controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Implementation of Specific Embodiment

Parameter ranges for example silane-based silicon dioxide and titanium nitride processes using an example four-station PEALD/PECVD process tool (e.g., Lam Striker) are provided in Tables 1A and 1B. It will be appreciated that other suitable parameter ranges may be employed in other embodiments of film-forming process chemistries. For example, other parameter ranges may apply for silicon dioxide films formed from silane using $CO$ and/or $CO_2$ as an oxygen source and for titanium nitride films formed from Titanium halides using nitrogen atoms obtained from $N_2$, $NH_3$ and/or $N_2/H_2$ plasmas.

Tin Deposition:

TABLE 1A

| | |
|---|---|
| TiX (sccm) | 1-1000 |
| $N_2$ (sccm) | 0-10000 |
| $NH_3$ (sccm) | 10-10000 |
| $N_2O$ (sccm) | 0 |
| He (sccm) | 0-20000 |
| Ar (sccm) | 0-30000 |
| Pressure (torr) | 0.5-6.0 |
| Temp (C.) | 200-650 |
| HF Power (W) | 0-8000 |
| LF Power (W) | 0-3000 |

$SiO_2$ Deposition:

TABLE 1B

| | |
|---|---|
| $SiH_4$ (sccm) | 0.1-1000 |
| $N_2$ (sccm) | 0-20000 |
| $NH_3$ (sccm) | 0 |
| $N_2O$ (sccm) | 1-30000 |
| He (sccm) | 0-20000 |
| Ar (sccm) | 0-30000 |
| Pressure (torr) | 0.5-6.0 |
| Temp (C.) | 200-650 |
| HF Power (W) | 0-8000 |
| LF Power (W) | 0-3500 |

An example titanium nitride process using Titanium halides and ammonia and an example four-station process tool is provided in Table 2A and an example silicon dioxide process using silane and nitrous oxide and an example four-station process tool is provided in Table 2B.

Tin Deposition:

TABLE 2A

| | |
|---|---|
| TiX (sccm) | 200 |
| $NH_3$ (sccm) | 1040 |
| $N_2$ (sccm) | 6000 |
| $N_2O$ (sccm) | 0 |
| Ar (sccm) | 0 |
| Pressure (torr) | 2.8 |
| Temp (° C.) | 550 |
| HF Power (W) | 1000 |
| LF Power (W) | 100 |

SiO$_2$ Deposition:

TABLE 2B

| | |
|---|---|
| SiH$_4$ (sccm) | 40 |
| N$_2$O (sccm) | 24000 |
| N$_2$ (sccm) | 5000 |
| He (sccm) | 8000 |
| Ar (sccm) | 0 |
| Pressure (torr) | 1.5 |
| Temp (° C.) | 550 |
| HF Power (W) | 2500 |
| LF Power (W) | 0 |

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

The invention claimed is:

1. A method of forming a film stack on a patterned semiconductor substrate, the method comprising:
   depositing a conductive film; and
   depositing a dielectric film;
   such that the conductive and dielectric film depositions result in the formation of a conductor/dielectric film pair on a patterned semiconductor substrate; and
   repeating the depositing of the conductive and dielectric films to form a film stack comprising at least 20 pairs of alternating layers of conductor film and dielectric film;
   wherein the conductive and dielectric film depositions are conducted in the same processing tool or chamber, without breaking vacuum between the film depositions; and
   wherein there is no substantial cross-contamination between the conductive and dielectric film depositions.

2. The method of claim 1, wherein the conductive and dielectric film pairs are deposited in the stack at a rate of at least 5 wafers per hour.

3. The method of claim 1, wherein the conductive and dielectric film pair depositions are conducted in different modules of the same tool without breaking vacuum between the depositions.

4. The method of claim 1, wherein the conductive and dielectric film pair depositions are conducted on different stations in the same module of the same tool without breaking vacuum between the depositions.

5. The method of claim 1, wherein the conductive and dielectric film pair depositions are conducted on the same station in the same module of the same tool without breaking vacuum between the depositions.

6. The method of claim 1, wherein at least 50 of the metal and/or conductive metal nitride and silicon oxide film pairs are deposited.

7. The method of claim 1, wherein the conductive film has a maximum resistivity of 500 micro Ohm cm.

8. The method of claim 7, wherein the conductive film is a metal or metal nitride.

9. The method of claim 8, wherein the conductive film is TiN.

10. The method of claim 1, wherein the dielectric is an oxide.

11. The method of claim 10, wherein the oxide is SiO2.

12. The method of claim 1, wherein the depositions are conducted by thermal chemical vapor deposition (CVD).

13. The method of claim 1, wherein the depositions are conducted by plasma-enhanced chemical vapor deposition (PECVD).

14. The method of claim 1, wherein the depositions are conducted by atomic layer deposition (ALD).

15. The method of claim 4, wherein the different stations are each micro-volume stations.

16. The method of claim 15, wherein the micro-volume stations comprise multiple throttle valves, one for the dielectric station(s) and one for the conductor station(s) such that pressures can be independently maintained.

17. The method of claim 15, wherein exhaust for each station is local and not shared, such that exhaust from each station can stay independent without cross mixing/contamination of gases.

18. The method of claim 15, wherein cross-contamination between stations in the module is prevented by virtual sealing with curtain gas.

19. The method of claim 15, wherein the station hardware comprises ceramic to avoid corrosion or contamination.

20. The method of claim 4, wherein the conductive and dielectric film pairs are deposited in the stack at a rate of at least 5 wafers per hour.

* * * * *